United States Patent [19]
Itoh et al.

[11] Patent Number: 6,156,584
[45] Date of Patent: Dec. 5, 2000

[54] METHOD OF MANUFACTURING A SEMICONDUCTOR LIGHT EMITTING DEVICE

[75] Inventors: Norikazu Itoh; Shunji Nakata; Yukio Shakuda; Masayuki Sonobe; Tsuyoshi Tsutsui, all of Kyoto, Japan

[73] Assignee: Rohm Co., Ltd., Kyoto, Japan

[21] Appl. No.: 09/048,110

[22] Filed: Mar. 26, 1998

[30] Foreign Application Priority Data

Mar. 28, 1997 [JP] Japan .................................. 9-077818

[51] Int. Cl.⁷ .............................................. H01L 21/302
[52] U.S. Cl. ................................................ 438/33; 438/462
[58] Field of Search ........................... 438/113, 114, 438/22, 25, 26, 33, 460, 462

[56] References Cited

U.S. PATENT DOCUMENTS

| | | | |
|---|---|---|---|
| 5,148,190 | 9/1992 | Cholewa et al. | 438/33 |
| 5,248,792 | 9/1993 | Forster et al. | 438/33 |
| 5,310,967 | 5/1994 | Kaneno et al. | 438/33 |
| 5,593,815 | 1/1997 | Ahn | 438/33 |
| 5,904,548 | 5/1999 | Orcutt | 438/462 |
| 5,939,735 | 8/1999 | Tsutsui et al. | 257/98 |

FOREIGN PATENT DOCUMENTS 07273069  10/1995  Japan .

*Primary Examiner*—Savitri Mulpuri
*Attorney, Agent, or Firm*—Arent Fox Kintner Plotkin & Kahn, PLLC

[57] ABSTRACT

Deposited on a wafer-like substrate for forming a plurality of light emitting device chips is a semiconductor layer laminate with a different property from that of the substrate. Then, electrodes are provided on and in electric connection with a top semiconductor layer of a first conductivity type of the semiconductor layer laminate, and on and in electric connection with a semiconductor layer of a second conductivity type, exposed by locally etching the semiconductor layer laminate, in association with the individual chips. Then, the semiconductor layer laminate is etched at boundary portions between the chips to expose the substrate, and the substrate is broken at the exposed portions into the chips. As the semiconductor layer laminate is etched out at the boundary portions between the chips before breaking the wafer, breaking can be facilitated without damaging the light emitting portions of the semiconductor layer laminate. This helps provide high-performance semiconductor light emitting devices.

7 Claims, 2 Drawing Sheets

METHOD OF MANUFACTURING A SEMICONDUCTOR LIGHT EMITTING DEVICE

BACKGROUND OF THE INVENTION

The present invention relates to a method of manufacturing a semiconductor light emitting device, which forms a semiconductor layer laminate including a p-type layer and an n-type layer on a wafer-like substrate and then breaking down the wafer into individual chips. More particularly, this invention relates to a method of manufacturing a semiconductor light emitting device that can facilitate breakdown of such a wafer whose substrate is hard to break into individual chips as in the case of a semiconductor light emitting device for bluish color which has a gallium nitride-based compound semiconductor layer laminate formed on a sapphire substrate.

A conventional method of fabricating chips of semiconductor light emitting devices (hereinafter called LED chips) which emits bluish light is carried out as follows. As shown in FIG. 3, an n-type layer (clad layer) 23 of, for example, n-type GaN, an active layer (light emitting layer) 24 of a material whose light emitting wavelength is so determined as to provide a smaller band-gap energy than that of the clad layer, e.g., an InGaN-based (which means, throughout the specification, that the ratio of In to Ga is variable) compound semiconductor, and a p-type layer (clad layer) 25 of p-type GaN are epitaxially grown in order on a sapphire substrate 21. P-side (upper) electrodes 28 are provided on the top surface of the p-type layer 25, and n-side (lower) electrodes 29 are provided on the top surface portions of the n-type layer 23 which have been exposed by locally etching the semiconductor layer laminate. Then, the resultant structure is scribed at boundary portions S between chips with a diamond scriber or the like, forming notches 21a. Force is applied to the notch portions 21a to break the structure into individual chips. With regard to the n-type layer 23 and the p-type layer 25, an AlGaN-based (which means, throughout the specification, that the ratio of Al to Ga is variable) compound semiconductor layer is frequently used by the side of the active layer 23 in order to enhance the carrier trapping effect. Further, at the time of etching the aforementioned semiconductor layer laminate, those portions at the boundary portions S between the chips at which breaking will take place are simultaneously etched to expose the n-type layer 23, thus facilitating the breakdown process.

To break a wafer into individual chips, as apparent from the above, the conventional fabrication method employs a scheme of locally etching the semiconductor layer laminate to make it thinner and forming notches at the back of the substrate before chip separation. If a rigid substrate like a sapphire substrate is used, however, notches are merely formed shallow which makes it very difficult to break the rigid sapphire substrate at the notches. What is more, although the semiconductor layer laminate is locally etched on the top surface side of the substrate, part of the semiconductor layer laminate like the n-type layer, which is of a different material from that of the substrate, still remains attached to the substrate. This makes it harder to break the substrate. Even if the substrate is forcibly broken down to chips, therefore, cracking is likely to occur at the non-etched side of the semiconductor layer laminate, damaging the light emitting layer portion like the active layer.

SUMMARY OF THE INVENTION

Accordingly, it is an object of the present invention to provide a method of manufacturing a semiconductor light emitting device, which can facilitate breaking (cutting and separation) of a wafer into individual chips without damaging the light emitting portion of the semiconductor layer laminate.

A method of manufacturing a semiconductor light emitting device according to this invention comprises the steps of forming on a wafer-like substrate a semiconductor layer laminate with a different property from that of the substrate; providing electrodes on and in electric connection with a top semiconductor layer of a first conductivity type surface of the semiconductor layer laminate, and electrodes on and in electric connection with a semiconductor layer of a second conductivity type, exposed by locally etching the semiconductor layer laminate, in association with individual chips; and breaking the wafer into the chips, and is characterized by etching the semiconductor layer laminate at boundary portions between the chips to expose the substrate, and breaking the substrate at the exposed portions.

"Breaking" here means separation of a wafer into individual chips by scribing and forcing (cracking), cutting or the like.

The feature makes it unnecessary to simultaneously break the substrate and a layer in the semiconductor layer laminate which has a different property from that of the substrate, thus facilitating breaking of a wafer into chips, and making it hard to form cracking at the light emitting portions of the semiconductor layer laminate.

This breaking is made easily by forming linear notches at the back of the substrate at breaking portions thereof to break the substrate, or forming linear notches both at the back of the substrate and that surface of the semiconductor layer laminate which is exposed by etching at breaking portions of the substrate.

It is particularly advantageous if the substrate is a sapphire substrate and the semiconductor layer laminate is formed of a gallium nitride-based compound semiconductor, which facilitates the formation of the chips of light emitting devices having a semiconductor layer laminate deposited on the sapphire substrate that is difficult to break.

The "gallium nitride-based compound semiconductor layer" here is a compound of Ga, a group III element, and N, a group V element, or a similar compound with part of Ga substituted with another group III element and/or with part of N substituted with another group V element, such as P or As.

The semiconductor layer laminate in each light emitting device is of a double heterojunction type having a clad layer of the second conductivity type, an active layer and a clad layer of the first conductivity type. The clad layers of the first conductivity type and the second conductivity type may be formed of a GaN or AlGaN-based compound semiconductor and the active layer may be formed of an InGaN-based compound semiconductor.

Further, a current diffusion layer comprised of a metal layer may be formed between the clad layer of the second conductivity type and an electrode which is electrically connected to the clad layer of the second conductivity type.

A mask of Ti may be used at the time of etching the semiconductor layer laminate until the substrate is exposed at the boundary portions between the chips.

DETAILED DESCRIPTION OF THE PREFERRED EMBODIMENTS

Figure 1:
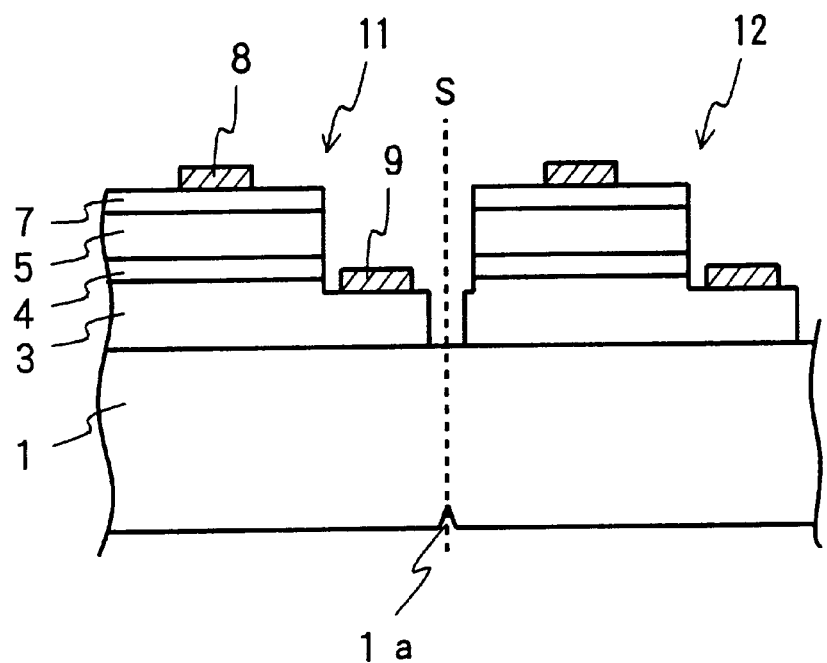
FIG. 1 is an explanatory cross-sectional view showing a pre-breaking state provided by a fabrication method according to a first embodiment of this invention.

FIG. 1 presents an explanatory partially cross-sectional view showing a pre-breaking state provided by a fabrication method according to the first embodiment of this invention, which deposits a gallium nitride-based compound semiconductor layer suitable for emission of bluish light on a wafer-like substrate and breaks the wafer into individual LED chips.

As shown in FIG. 1, a fabrication method for semiconductor light emitting devices according to this invention is characterized by forming a semiconductor layer laminate having an n-type layer 3 and a p-type layer 5 on a wafer-like substrate 1, providing electrodes 8 on and in electric connection with the top semiconductor layer of a first conductivity type (p-type layer 5) of the semiconductor layer laminate, and electrodes 9 on and in electric connection with a semiconductor layer of a second conductivity type (n-type layer 3) exposed by locally etching the semiconductor layer laminate, in association with a plurality of LED chips 11, 12 and so forth, and etching the laminated semiconductor layers 3–5 at boundary portions S between the chips to expose the substrate 1, and breaking the substrate 1 at the exposed portions to break the wafer into the LED chips 11, 12 and so forth.

The fabrication method for semiconductor light emitting devices according to the first embodiment of this invention will be described in detail with reference to FIG. 1. First, by using metal-organic chemical vapor deposition (MOCVD) with necessary reaction gases, such as an $NH_3$ reaction gas for N, a trimethylgallium (TMG) reaction gas for Ga, a trimethylaluminum (TMA) reaction gas for Al and a trimethylindium (TMIn) reaction gas for In, and a necessary dopant gas, such as an n-type dopant $H_2Se$, a p-type dopant dimethylzinc (DMZn) or a cyclopentadienyl magnesium ($Cp_2Mg$), the n-type layer 3, which has a lamination of a low-temperature buffer layer (not shown) of GaN, and an n-type GaN layer and/or an AlGaN-based compound semiconductor layer to be a clad layer, is deposited about 1 to 5 $\mu$m thick on the surface of the substrate 1 of sapphire ($Al_2O_3$ single crystal), an active layer 4 of a material whose bandgap energy is smaller than that of the clad layer, e.g., an InGaN-based compound semiconductor, is deposited about 0.05 to 0.3 $\mu$m on the n-type layer 3, and then the p-type layer (clad layer) 5, which is comprised of a p-type AlGaN-based compound semiconductor layer and/or GaN layer, is deposited about 0.2 to 1 $\mu$m on the active layer 4.

Then, Ni and Au are provided by vacuum vapor deposition on the resultant structure, which is in turn sintered to form a current diffusion layer 7 of metal with a thickness of approximately 2 to 100 nm. When this current diffusion layer 7 is provided, the p-side electrodes 8 are electrically connected to the p-type layer 5 via the current diffusion layer 7. If this current diffusion layer 7 is not provided, on the other hand, the p-side electrodes 8 are electrically connected to the p-type layer 5 directly or via another p-type semiconductor layer.

To form the n-side electrodes 9, a resist film is provided on the surface of the semiconductor layer laminate and is then patterned, and the current diffusion layer 7 and the laminated semiconductor layers 3–5 are locally etched to expose the n-type layer 3. With a mask formed again with a resist film, etching of the n-type layer 3 continues to expose the substrate 1 in such a way as to expose only the boundary portions S between the LED chips 11, 12 and so forth or those portions at which breaking will take place. Those etching processes can be conducted by reactive ion etching with a chlorine gas or the like. To etch a thick semiconductor layer, a mask of Ti or the like may be used so that the mask can remain throughout the etching process until the exposure of the substrate 1.

Then, metals Ti and Al for forming the n-side electrodes 9 on the surface of the n-type layer 3 exposed by the first etching are deposited approximately 0.1 $\mu$m thick and 0.3 $\mu$m thick, respectively, by vacuum vapor deposition or the like, and are sintered, thus yielding the n-side electrodes 9. Further, parts of an unillustrated protection film of silicon-nitride (SiN) or the like (which may not be provided) are removed and Ti and Au are then deposited by vacuum vapor deposition, forming the p-side electrodes 8.

Thereafter, linear notches 1a are formed in those portions of the substrate which correspond to the boundary portions S between the individual LED chips 11, 12 and so forth at the back of the substrate 1 using a diamond scriber. Then, spontaneous force is applied to the notch portions 1a to break the wafer-like substrate 1 into the LED chips 11, 12 and so forth.

According to this invention, because the semiconductor layers laminated on the substrate have all been removed at the entire boundary surrounding chips at which breaking will take place at the time of breaking the wafer into the individual chips, it is unnecessary to simultaneously break the substrate and the semiconductor layers of different materials from one another. This can permit breaking to be accomplished easily in a short period of time, and makes it hard to form cracking in the semiconductor layer laminate. As a result, deterioration of the light emitting characteristic becomes less likely to occur.

Figure 2:
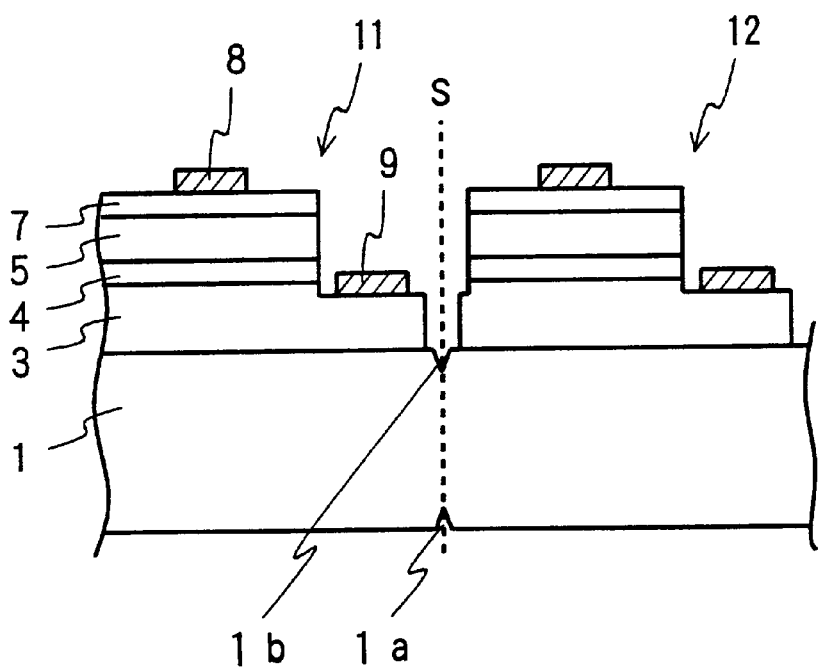
FIG. 2 is a cross-sectional view similar to the one in FIG. 1 for explaining a fabrication method according to another embodiment of this invention.
Figure 3:
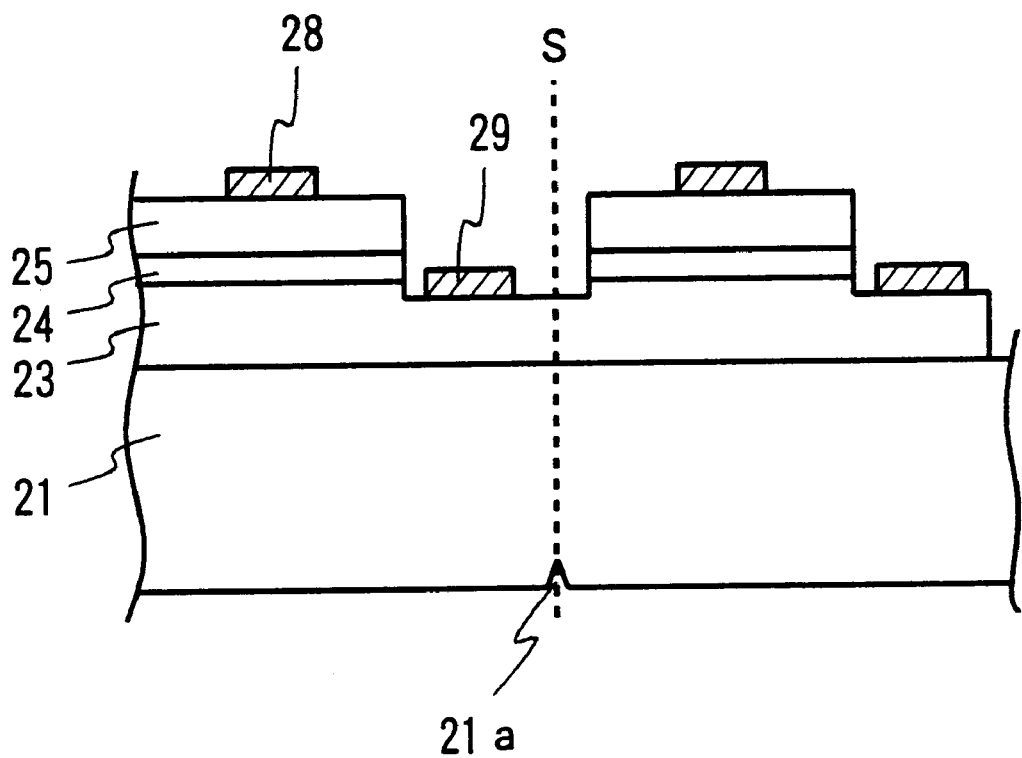
FIG. 3 is a diagram for explaining a conventional method of fabricating semiconductor light emitting devices.

FIG. 2 is a diagram, similar to the one in FIG. 1, for explaining a fabrication method according to another embodiment of this invention. While the method exemplified in FIG. 2 is the same as the one shown in FIG. 1 in etching the laminate of the semiconductor layers 3–5 at the boundary portions S between the LED chips 11, 12 and so forth to expose the substrate 1, it forms linear notches 1b at the top of the etching-exposed substrate 1 along the break lines S with a diamond scriber as well as the notches 1a at the back of the substrate 1 and then applies force to the notch portions 1a at the back of the substrate 1 to break the wafer. Note that same reference numerals are given to those components which are the same as the corresponding components shown in FIG. 1 to avoid the redundant description.

This method forms cracking between each pair of notches 1a and 1b formed at the respective sides of the substrate 1 to break the substrate 1 between the notches 1a and 1b. This makes breaking easier and makes it less likely for a breaking-originated crack to extend toward the semiconductor layers.

Although the semiconductor layers to be laminated are specifically formed of gallium nitride-based compound semiconductors in the above-described embodiments, the method of this invention is not limited to those specific examples but may be used for other sorts of semiconductor layers or other structures if the substrate is hard to break. Further, the structure of the semiconductor layer laminate is not restricted to a double heterojunction type having the active layer sandwiched by the n-type layer and the p-type layer, but the semiconductor layer laminate may take other structures like pn junction having the n-type layer connected directly to the p-type layer.

In short, this invention can relatively easily separate even semiconductor light emitting devices that have semiconductor layers laminated on a substrate which makes wafer-to-chips breaking difficult, such as a sapphire substrate, and makes less likely to form cracking in the semiconductor layers so as to be able to avoid deterioration of the light emitting characteristic. Accordingly, this invention can provide semiconductor light emitting devices with excellent characteristic.

Although preferred embodiments have been described in some detail, it is to be understood that certain changes can be made by those skilled in the art without departing from the spirit and scope of the invention as defined by the appended claims.

What is claimed is:

1. A method of manufacturing a semiconductor light emitting device comprising the steps of:

epitaxially growing a semiconductor layer laminate made of gallium nitride-based compound semiconductor on a wafer form substrate made of sapphire;

providing electrodes on and in electric connection with a top semiconductor layer of a first conductivity type of said semiconductor layer laminate, and electrodes on and in electric connection with a semiconductor layer of a second conductivity type, exposed by locally etching said semiconductor layer laminate, in association with individual chips;

etching said semiconductor layer laminate at the entire boundary surrounding said chips to expose said substrate; and breaking said substrate at said exposed portions to separate said wafer into said chips.

2. The method according to claim 1, wherein linear notches are formed at a back of said substrate at breaking thereof to break said substrate.

3. The method according to claim 2, wherein notches are formed in the surface of said substrate which is exposed by etching said semiconductor layer laminate at said entire boundary.

4. The method according to claim 1, wherein said semiconductor layer laminate has a clad layer of said second conductivity type, an active layer and a clad layer of said first conductivity type.

5. The method according to claim 4, wherein a current diffusion layer comprised of a metal layer is formed between said clad layer of said second conductivity type and those electrodes which are electrically connected to said clad layer of said second conductivity type.

6. The method according to claim 4, wherein said clad layers of said first conductivity type and said second conductivity type are formed of a GaN or AlGaN-based compound semiconductor and said active layer is formed of an InGaN-based compound semiconductor.

7. The method according to claim 1, wherein a mask of Ti is used at a time of etching said semiconductor layer laminate until said substrate is exposed at said boundary between said chips.

* * * * *